(12) United States Patent
Ito

(10) Patent No.: US 11,171,027 B2
(45) Date of Patent: Nov. 9, 2021

(54) STORING SYSTEM

(71) Applicant: Murata Machinery, Ltd., Kyoto (JP)

(72) Inventor: Yasuhisa Ito, Ise (JP)

(73) Assignee: Murata Machinery, Ltd., Kyoto (JP)

( * ) Notice: Subject to any disclaimer, the term of this patent is extended or adjusted under 35 U.S.C. 154(b) by 99 days.

(21) Appl. No.: 16/612,924

(22) PCT Filed: Apr. 17, 2018

(86) PCT No.: PCT/JP2018/015894
§ 371 (c)(1),
(2) Date: Nov. 12, 2019

(87) PCT Pub. No.: WO2018/211898
PCT Pub. Date: Nov. 22, 2018

(65) Prior Publication Data
US 2020/0203203 A1 Jun. 25, 2020

(30) Foreign Application Priority Data
May 19, 2017 (JP) .............................. JP2017-100262

(51) Int. Cl.
*H01L 21/677* (2006.01)
*B65G 1/04* (2006.01)

(52) U.S. Cl.
CPC ...... *H01L 21/67706* (2013.01); *B65G 1/0457* (2013.01); *B65G 1/0464* (2013.01); *H01L 21/67724* (2013.01); *H01L 21/67769* (2013.01)

(58) Field of Classification Search
CPC ................ B65G 1/0464; B65G 1/0457; H01L 21/67706; H01L 21/67724;
(Continued)

(56) References Cited

U.S. PATENT DOCUMENTS 4,088,232 A * 5/1978 Lilly .................... B65G 1/0464
294/65.5
9,004,840 B2 * 4/2015 Kinugawa ......... H01L 21/67769
414/281

(Continued)

FOREIGN PATENT DOCUMENTS

| EP | 2 071 617 | 6/2009 |
| JP | 10-109887 | 4/1998 |

(Continued)

*Primary Examiner* — Glenn F Myers
(74) *Attorney, Agent, or Firm* — DLA Piper LLP (US)

(57) ABSTRACT

A storing system includes: a traveling rail including a plurality of first rails extending in a first direction and a plurality of second rails extending in a second direction, the first rails and the second rails being disposed in a grid pattern on the same horizontal plane to form lengthwise and crosswise a plurality of opening areas each of which is surrounded by a pair of the first rails and a pair of the second rails; a vehicle including a traveling unit and a transfer unit; and a storage unit on which a FOUP is to be placed. The storage unit includes a plurality of rack units adjacent to each other. Each of the rack units includes a placement member on which the FOUP is to be placed, is provided such that the placement member is positioned directly below the corresponding opening area, and is detachable from the traveling rail.

13 Claims, 9 Drawing Sheets

(58) Field of Classification Search
CPC ......... H01L 21/67733; H01L 21/67736; H01L 21/67769
See application file for complete search history.

(56) References Cited

U.S. PATENT DOCUMENTS

| | | |
|---|---|---|
| 9,415,934 B2 * | 8/2016 | Ikeda ................ H01L 21/67733 |
| 2008/0056864 A1 | 3/2008 | Wada et al. |
| 2008/0075568 A1 | 3/2008 | Benedict et al. |
| 2008/0156760 A1 | 7/2008 | Maetaki |
| 2010/0278622 A1 | 11/2010 | Huang et al. |
| 2012/0275886 A1 * | 11/2012 | Ota .................. H01L 21/67769 |
| | | 414/222.08 |
| 2015/0332948 A1 | 11/2015 | Ikeda et al. |
| 2016/0268152 A1 | 9/2016 | Fosnight et al. |

FOREIGN PATENT DOCUMENTS

| | | |
|---|---|---|
| JP | 2008-056450 | 3/2008 |
| JP | 2008-162778 | 7/2008 |
| JP | 2008-247561 | 10/2008 |
| JP | 2009-137740 | 6/2009 |
| WO | 2015/174181 | 11/2015 |

* cited by examiner

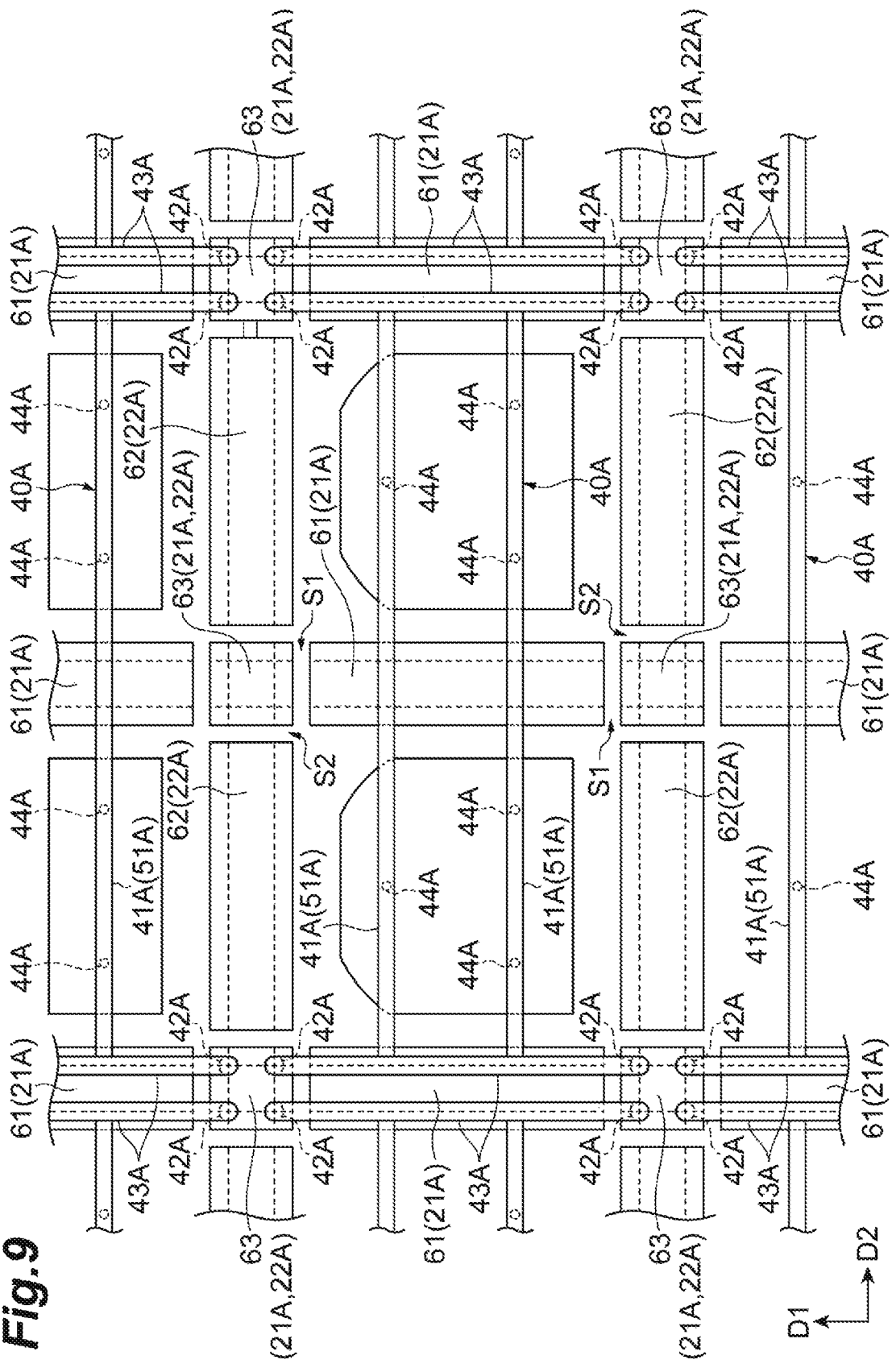

STORING SYSTEM

TECHNICAL FIELD

This disclosure relates to a storing system.

BACKGROUND

As a storing system used for a semiconductor manufacturing plant, for example, a system including: a traveling rail including a plurality of rails disposed in a grid pattern on the same horizontal plane: a vehicle configured to travel on the traveling rail and hold an article to raise and lower the article; and a storage unit, disposed below the traveling rail, on which an article is to be placed is known from WO 2015/174181, for example. In the storing system, the vehicle delivers and receives an article to and from the storage unit through an opening area formed between rails.

In the storing system described above, below the traveling rail, the storage unit is provided to extend across all areas except areas directly above a load port. In such a configuration, flexibility in installation of the storage unit is low.

It could therefore be helpful to provide a storing system that enables flexibility in installation of a storage unit to be improved.

SUMMARY

I thus provide:

A storing system includes: a traveling rail including a plurality of first rails extending in a first direction and a plurality of second rails extending in a second direction orthogonal to the first direction, the first rails and the second rails being disposed in a grid pattern on the same plane to form lengthwise and crosswise a plurality of areas each of which is surrounded by a pair of the first rails adjacent to each other and a pair of the second rails adjacent to each other; a vehicle including a traveling unit configured to travel on the traveling rail in both directions of the first direction and the second direction and a transfer unit configured to hold an article to raise and lower the article; and a storage unit, provided below the traveling rail, on which the article is to be placed. The vehicle delivers and receives the article to and from the storage unit. The storage unit includes a plurality of rack units adjacent to each other. Each of the rack units includes a placement member on which the article is to be placed, is provided such that the placement member is positioned directly below the corresponding area, and is detachable from the traveling rail.

In this storing system, compared to when the entire storage unit is formed by a single rack, flexibility in installation, removal, position change, and the like of the storage unit can be improved.

Each of the rack units may include a support member supporting the corresponding placement member, and the support member may be suspended from the traveling rail in a detachable manner With this configuration, by attaching and detaching the support member to and from the traveling rail, the rack unit including the placement member can be attached to and detached from the traveling rail.

At least one of the rack units may be formed such that a plurality of placement portions, on each of which the article is to be placed, are aligned in a row in the corresponding placement member, and may also be provided such that a direction in which the placement portions are aligned in a row is parallel to the first direction or the second direction. With this configuration, compared to when all of the respective rack units are configured to correspond to a plurality of opening areas that are arranged in a matrix pattern (i.e., arranged to be aligned in a plurality of rows in both directions of the first direction and the second direction), flexibility in installation, removal, position change and the like of the storage unit can be improved. This is particularly advantageous, for example, when the storage unit for only one row of opening areas is desired to be removed.

Each of the areas may form an opening area having a size that allows the article to pass through the opening area in an up-and-down direction, and the vehicle may travel while holding the article above the traveling rail, and deliver and receive the article to and from the placement member through the opening area. With this configuration, the article can be delivered to and received from the storage unit only by, with the vehicle, raising and lowering the article in the vertical direction through the opening area.

Each of the support members may be suspended from an intersection portion of the corresponding first rail and the corresponding second rail, and the vehicle may travel to cause the article to pass between the support members while holding the article below the traveling rail. With this configuration, when the vehicle delivers the article to a destination below the traveling rail, the traveling rail is less likely to hinder operation of delivering the article, and thus flexibility in layout of destinations can be improved. Furthermore, in this configuration, by the support members provided in such positions that travel of the vehicle is less likely to be hindered, the placement members can be supported directly below the corresponding opening areas.

Each of the placement members may be a pair of beam-like members provided in a manner spaced apart from each other. With this configuration, the article is placed on the pair of beam-like members, and thus air currents can be prevented from being hindered by the rack units compared to when the article is placed on a plate-like member, for example. Particularly when this storing system is used in a clean room, air currents in up-and-down directions for keeping inside of the clean room in a clean state can be prevented from being hindered.

Flexibility in installation of the storage unit can thus be improved.

BRIEF DESCRIPTION OF THE DRAWINGS

FIG. 9 is a bottom view of the rack units in FIG. 8.

REFERENCE SIGNS LIST

Figure 1:
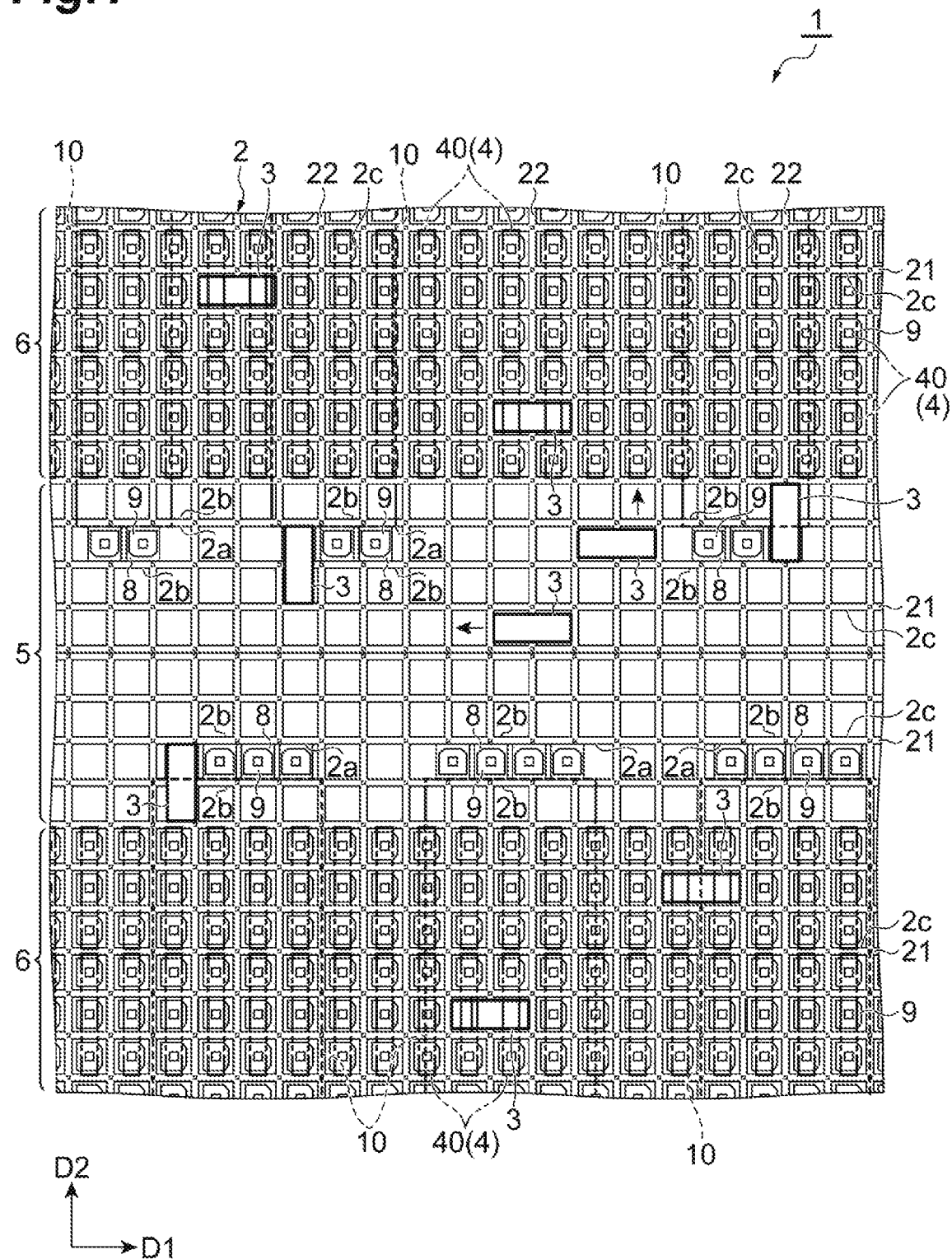
FIG. 1 is a plan view of a storing system according to a first example.

1, 1A storing system
2, 2A traveling rail
2a first opening area (area, opening area)
2b second opening area (area, opening area)
2c third opening area (area, opening area)

3, 3A vehicle
4 storage unit
9 FOUP (article)
21, 21A first rail
22, 22A second rail
31, 31A traveling unit
32 transfer unit
40, 40A rack unit
41, 41A beam-like member
42, 42A support member
50, 50A placement portion
51, 51A placement member
D1 first direction
D2 second direction

DETAILED DESCRIPTION

Examples will now be described in detail with reference to the drawings. Like or equivalent elements are designated by like reference signs in each drawing, and duplicate description is omitted.

First Example

Configuration of Storing System

Figure 2:
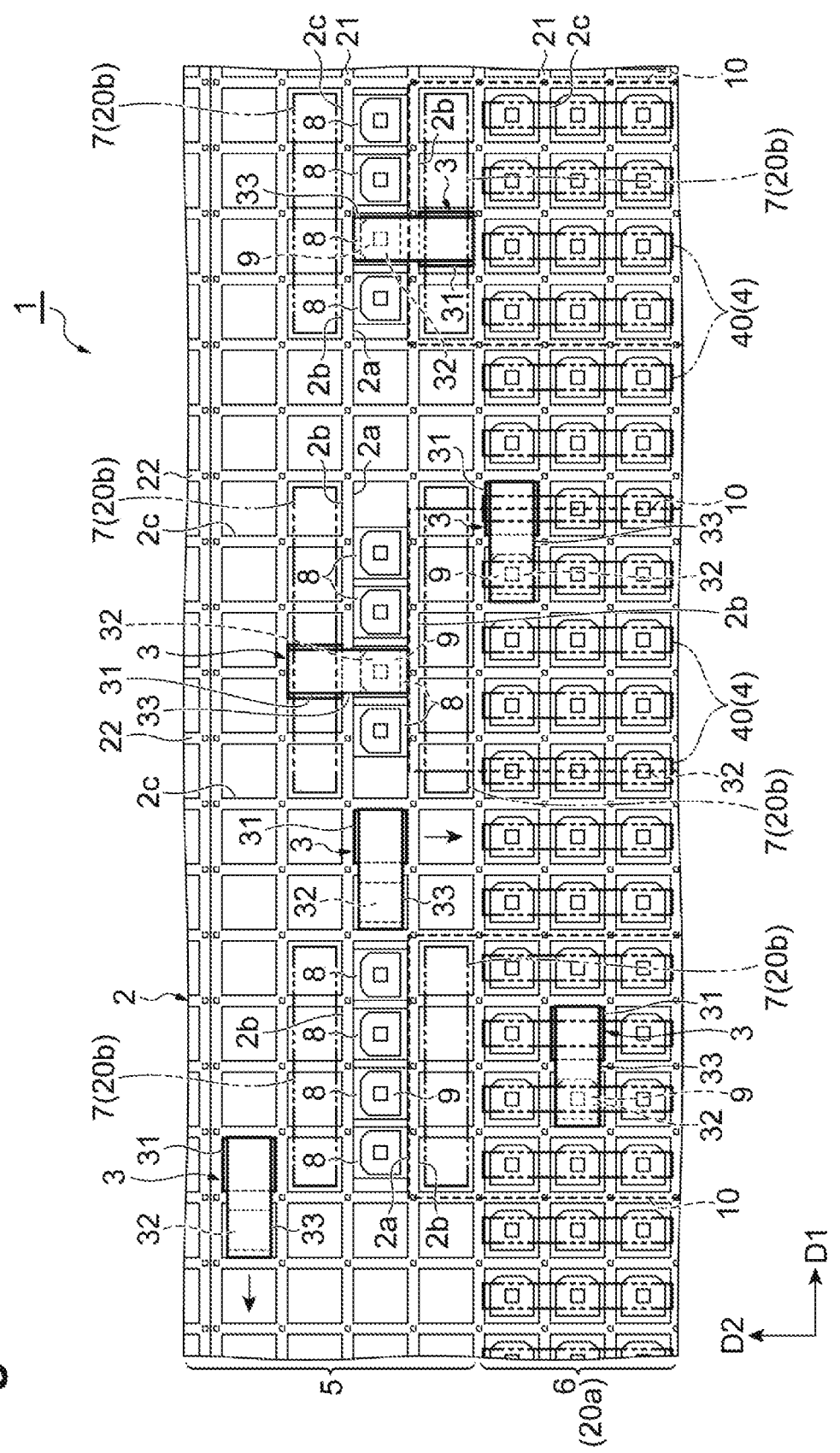
FIG. 2 is a partially enlarged view of the storing system in FIG. 1.

As illustrated in FIGS. 1 and 2, a storing system 1 includes a traveling rail 2, a plurality of vehicles 3, and a storage unit 4. In a semiconductor manufacturing plant, the storing system 1 is installed above a plurality of semiconductor processing devices 10 each including a plurality of device ports 8. The storing system 1 temporarily stores front opening unified pods (FOUPs) 9 in each of which a plurality of semiconductor wafers are accommodated. More specifically, in the storing system 1, a FOUP 9 is conveyed between the storage unit 4 and a device port 8 by a vehicle 3 configured to travel on the traveling rail 2, and the FOUP 9 (the FOUP 9 before being fed to the device port 8, or the FOUP 9 after being collected from the device port 8) is temporarily stored in the storage unit 4. To or from the storing system 1, the FOUP 9 is conveyed in or conveyed out by an overhead hoist transfer (OHT), for example. The OHT travels along a track installed between the storing system 1 and a ceiling of the semiconductor manufacturing plant.

Each of the semiconductor processing devices 10 is disposed below the traveling rail 2 in a manner aligned in a plurality of rows (two rows along the first direction D1 in FIG. 1). In each of the semiconductor processing devices 10, the corresponding device ports 8 are disposed to face each other between a pair of rows adjacent to each other. When a FOUP 9 is fed to a device port 8 of a semiconductor processing device 10 by a vehicle 3, semiconductor wafers accommodated in this FOUP 9 are brought into the semiconductor processing device 10. Subsequently, the semiconductor wafers are subjected to predetermined treatment in the semiconductor processing device 10, and are then accommodated in the FOUP 9 again. Thus, the FOUP 9 has changed to a state capable of being collected and conveyed by the vehicle 3.

The traveling rail 2 includes a plurality of first rails 21 and a plurality of second rails 22. Each of the first rails 21 extends linearly in the first direction D1, and a predetermined interval is formed between first rails 21 adjacent to each other. Each of the second rails 22 extends linearly in a second direction D2 orthogonal to the first direction D1, and a predetermined interval is formed between second rails 22 adjacent to each other. The first rails 21 and the second rails 22 are disposed in a grid pattern on the same horizontal plane.

Figure 3:
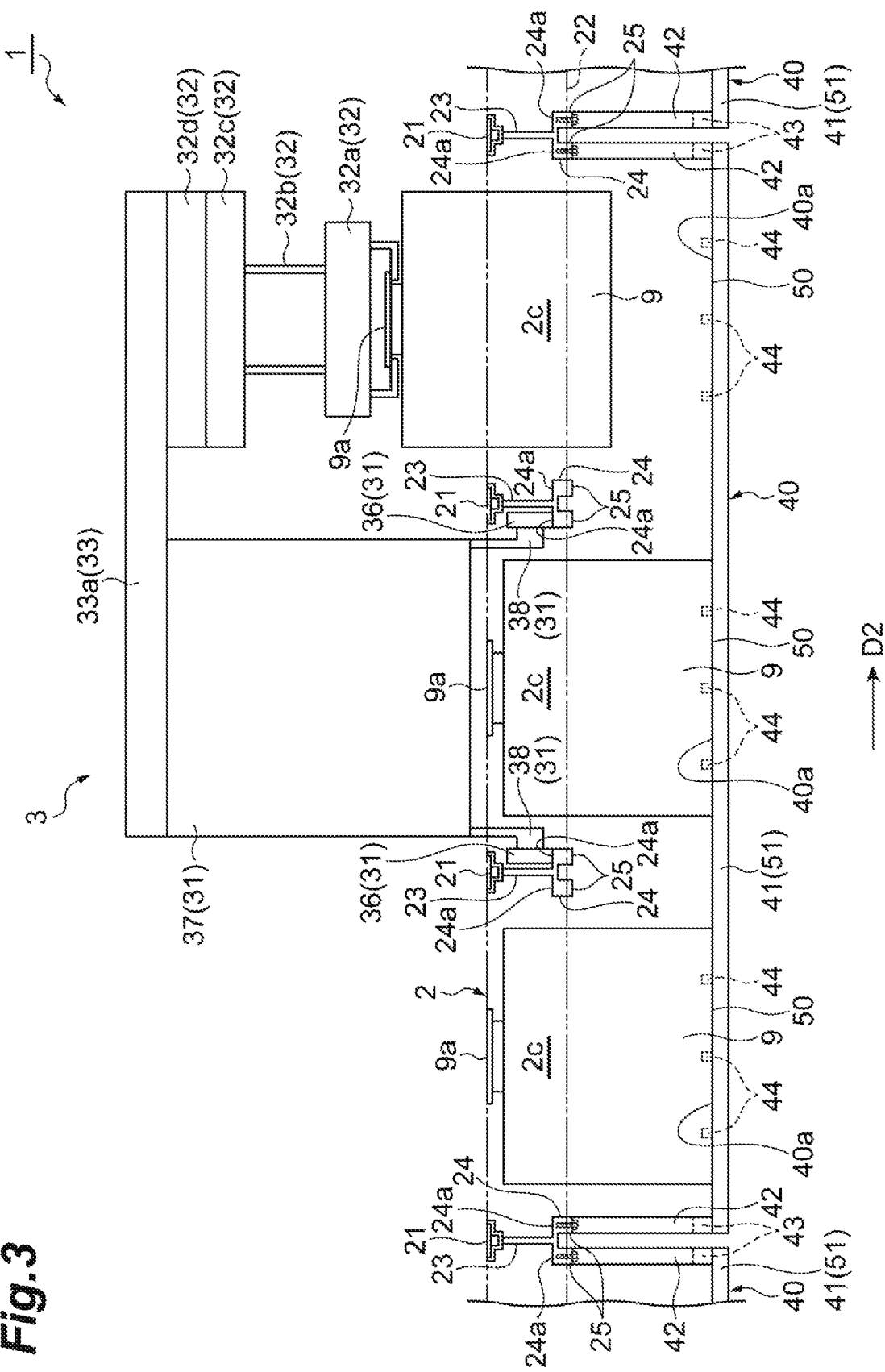
FIG. 3 is a front view of rack units included by the storing system in FIG. 1.

As illustrated in FIGS. 1, 2, and 3, each of the vehicles 3 includes a traveling unit 31, a transfer unit 32, and a protruding unit 33. The traveling unit 31 can travel in the first direction D1 along a pair of first rails 21 adjacent to each other, and also can travel in the second direction D2 along a pair of second rails 22 adjacent to each other. The traveling unit 31 includes a body portion 37, four wheels 36, and wheel support arms 38. Each of the wheels 36 is rotatably supported by the corresponding wheel support arm 38 that is provided to protrude downward from the body portion 37, and rolls on a tread 24a of the traveling rail 2.

The transfer unit 32 includes: a holding unit 32a configured to hold a flange portion 9a of a FOUP 9; belts 32b configured to suspend the holding unit 32a; a lifting drive unit 32c configured to raise and lower the holding unit 32a by winding and paying out the belts 32b; and a θ-rotating mechanism 32d configured to rotate the lifting drive unit 32c about the vertical direction (direction orthogonal to both the first direction D1 and the second direction D2). In FIG. 3, a state is illustrated in which the transfer unit 32 is delivering or receiving a FOUP 9 to or from the storage unit 4.

The protruding unit 33 causes the transfer unit 32 to protrude from the traveling unit 31 in either direction of the first direction D1 and the second direction D2. As one example, the protruding unit 33 includes a turning mechanism 33a. A base-end portion of the turning mechanism 33a is rotatably attached to the traveling unit 31, and the transfer unit 32 is attached to a distal-end portion of the turning mechanism 33a.

In the traveling rail 2, a plurality of rectangular (i.e., cell-like) areas are formed. Each of the rectangular areas is an area surrounded by a pair of first rails 21 adjacent to each other and a pair of second rails 22 adjacent to each other, and is formed in plurality lengthwise and crosswise. The expression "lengthwise and crosswise" means being in both the first direction D1 and the second direction D2, and the expression "each of the rectangular areas is formed in plurality lengthwise and crosswise" means that a plurality of the rectangular areas are formed in a matrix pattern to be aligned in both the first direction D1 and the second direction D2. Each of the rectangular areas forms an opening area having a size that allows a FOUP 9 to pass therethrough in the up-and-down direction.

The vehicle 3 uses the traveling unit 31 to travel, while using the holding unit 32a of the transfer unit 32 to hold a FOUP 9 above the traveling rail 2. The vehicle 3 also uses the transfer unit 32 to deliver and receive a FOUP 9 to and from the storage unit 4 through a predetermined opening area.

Among a plurality of the opening areas, a first opening area (opening area) 2a is an area positioned directly above each of the device ports 8. Among the opening areas, a second opening area (opening area) 2b is an area that is positioned directly below a position where the traveling unit 31 stops when the vehicle 3 delivers or receives a FOUP 9 to or from the device port 8 through the first opening area 2a while positioning the transfer unit 32 above the first opening area 2a. Among the opening areas, a third opening area (opening area) 2c is an area other than the first opening area 2a and the second opening area 2b.

Areas above the device ports 8 and below the traveling rail 2 are classified into a non-storage area 5 and a storage area 6. The non-storage area 5 includes areas directly below a plurality of sections each of which is formed by each of the first opening areas 2a and the respective areas formed adjacently to the first opening area 2a to surround the first opening area 2a, and also includes areas directly below areas of third opening areas 2c that are positioned (interposed) between the respective sections. The "areas that are positioned between the respective sections" mean, out of all combinations of two sections among a plurality of the sections, areas obtained by adding all of areas positioned between two sections that constitute at least one combination. In other words, the non-storage area 5 is an area within which the respective sections are positioned with respect to a line connecting, among outer boundaries of the respective sections, each of outer boundaries that do not face the other sections. The storage area 6 is an area other than the non-storage area 5, and the third opening areas 2c are formed directly above the storage area 6. In other words, the storage area 6 is an area outside of which the respective sections are positioned with respect to the line connecting, among the outer boundaries of the respective sections, each of the outer boundaries that do not face the other sections.

The storage unit 4 is not provided directly below, among the third opening areas 2c, all of areas that are formed adjacently to the first opening areas 2a to surround the first opening areas 2a. The storage unit 4 does not have to be provided to the non-storage area 5, and in this example, occurrence of traffic congestion with vehicles 3 can be prevented on the traveling rail 2 near the device ports 8.

The storage unit 4 is configured with a plurality of rack units 40 adjacent to each other in combination. Each of the rack units 40 includes a placement member 51 on which a FOUP 9 is to be placed (described in detail later), and is provided such that the placement member 51 is positioned directly below an area (opening area) surrounded by a pair of first rails 21 adjacent to each other and a pair of second rails 22 adjacent to each other. Each of the rack units 40 is attached to correspond to a plurality of third opening areas 2c that are formed adjacently to one first rail 21 or one second rail 22 in a manner arranged on both sides of the rail. On each of the placement members 51, a plurality of placement portions 50 are formed, each of which is a portion on which a FOUP 9 is to be placed. At least one of the rack units 40 is formed such that the placement portions 50 are aligned in a row on the placement member 51, and is provided such that the direction in which the placement portions 50 are aligned in a row is parallel to the first direction D1 or the second direction D2. In other words, each of the rack units 40 corresponds to the third opening areas 2c that are aligned in a row in either direction of the first direction D1 or the second direction D2. To or from each of the rack units 40, a FOUP 9 is delivered or received through each of the corresponding third opening areas 2c. As one example, in the storing system 1, each of the rack units 40 corresponds to three third opening areas 2c that are aligned in a row in the second direction D2.

Each of the first opening areas 2a is formed by partially removing at least one of the corresponding first rails 21 and the corresponding second rails 22. Each of the first opening areas 2a has a size corresponding to those of the second opening areas 2b and the third opening areas 2c. As one example, in the storing system 1, the first opening areas 2a are areas directly above a plurality of device ports 8 that are aligned in a row in the first direction D1.

Configurations of Traveling Rail and Rack Unit

Figure 4:
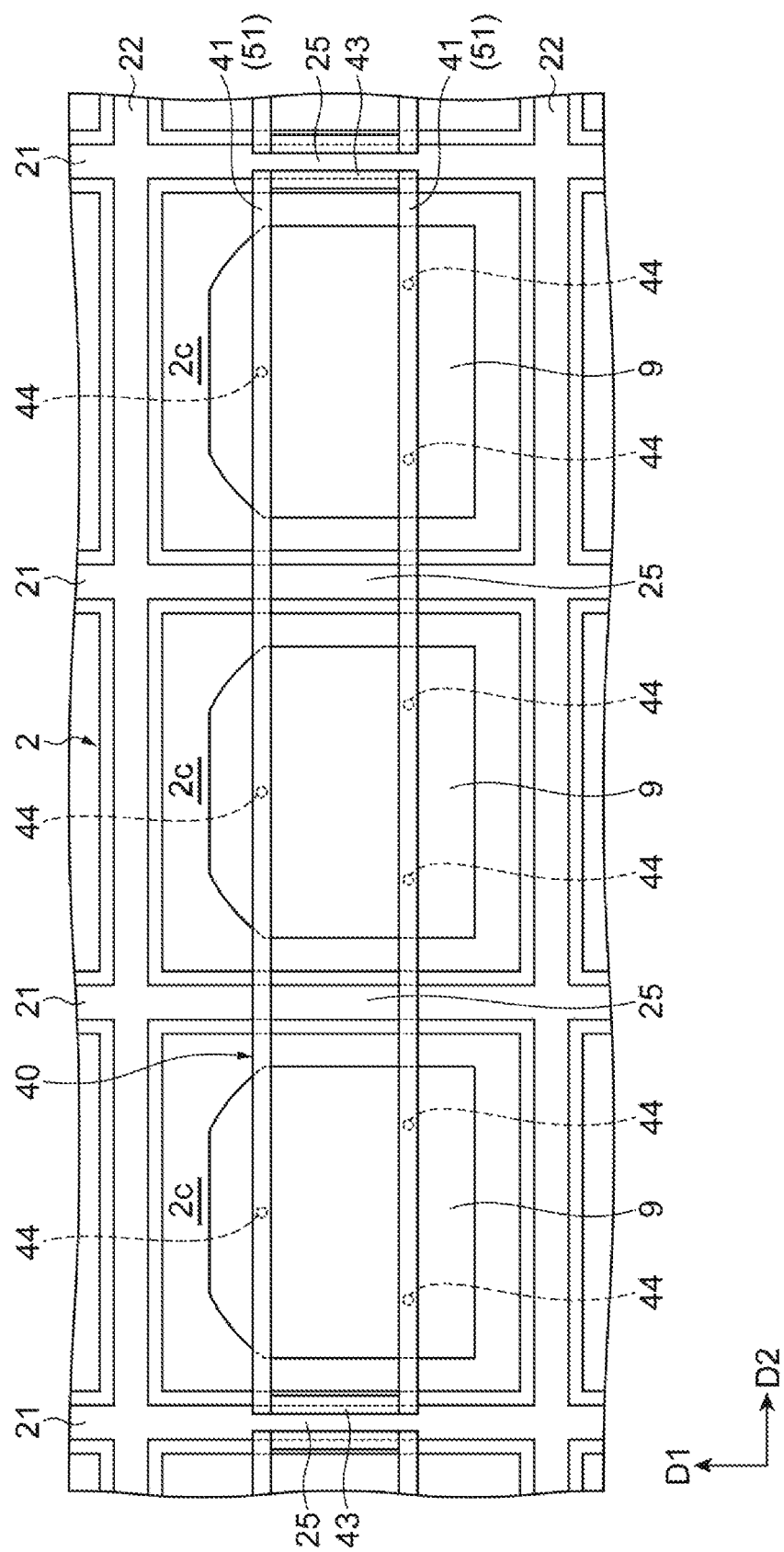
FIG. 4 is a bottom view of the rack units in FIG. 3.
Figure 5:
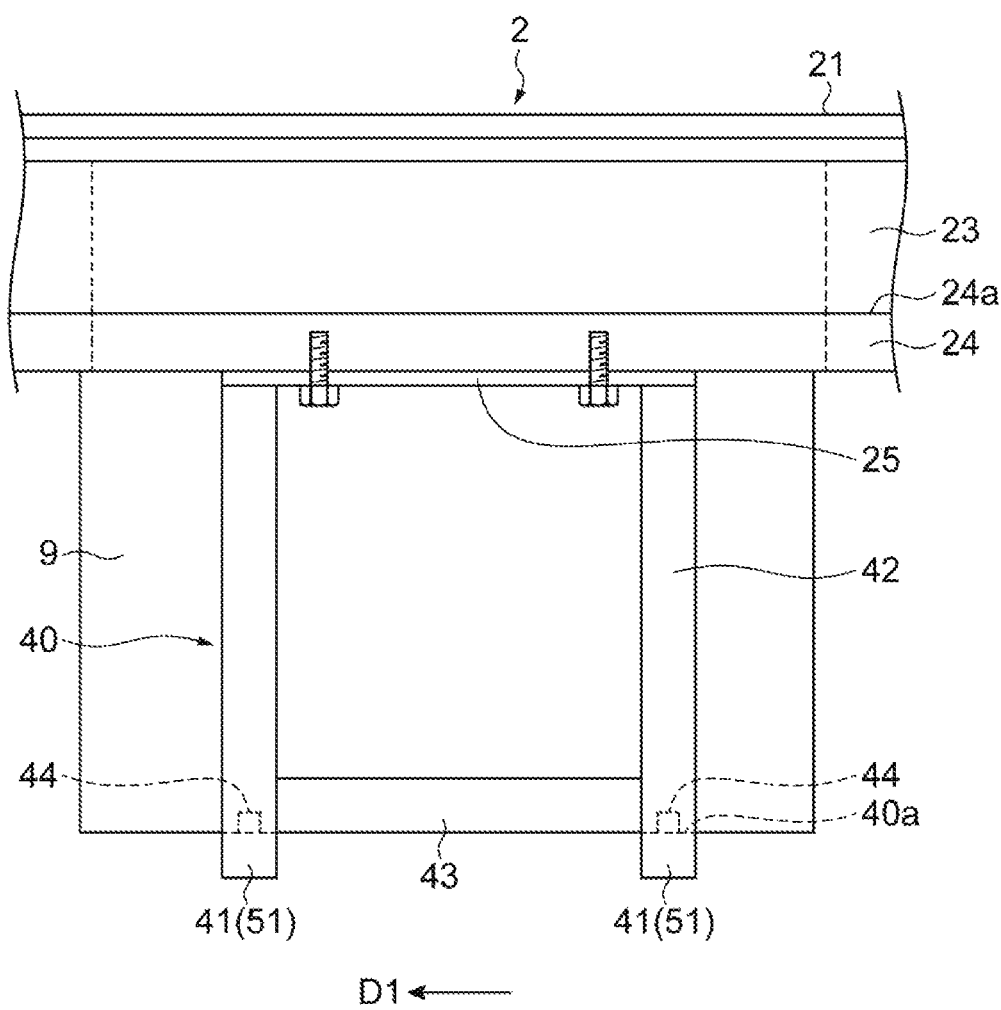
FIG. 5 is a side view of a rack unit in FIG. 3.

As illustrated in FIGS. 3, 4, and 5, each of the first rails 21 is formed with an H-shaped steel member having a web portion 23 that is vertically arranged. Upper surfaces of a flange portion 24 formed on the lower end of the web portion 23 are treads 24a for four wheels 36 that the traveling unit 31 of each of the vehicles 3 has. Each of the second rails 22 has the same configuration as that of the first rail 21. When the traveling unit 31 is positioned directly above a second opening area 2b or a third opening area 2c, the four wheels 36 are positioned at four intersection portions that are formed with a pair of the treads 24a (the treads 24a of the first rails 21) opposed to each other in the second direction D2 and a pair of the treads 24a (the treads 24a of the second rails 22) opposed to each other in the first direction D1. The traveling unit 31 changes the direction between the first direction D1 and the second direction D2 by changing the direction of the four wheels 36 simultaneously when the wheels 36 are positioned at the four intersection portions.

Each of the rack units 40 includes the placement member 51, a plurality of support members 42, and a plurality of reinforcement members 43. As described above, the placement member 51 is a member on which a FOUP 9 is to be placed. The placement member 51 is, for example, a pair of beam-like members 41 provided in a manner spaced apart from each other. The pair of beam-like members 41 extends, below a plurality of third opening areas 2c aligned in a row in either direction of the first direction D1 or the second direction D2, in the either direction. The pair of beam-like members 41 is disposed on the same horizontal plane to be parallel to each other. In other words, the pair of beam-like members 41 is horizontally arranged in parallel.

Each of the support members 42 is a member that supports the placement member 51. The respective support members 42 extend upward from both end portions of each of the pair of beam-like members 41. An upper-end portion of each of the support members 42 is attached to the corresponding first rail 21 or the corresponding second rail 22 in a detachable manner. In other words, each of the support members 42 is suspended from the traveling rail 2 in a detachable manner Specifically, each of the rack units 40 is suspended below the corresponding third opening areas 2c from the traveling rail 2, and is detachable from the traveling rail 2. As one example, in the storing system 1, a pair of beam-like members 41 extends in the second direction D2 below three third opening areas 2c aligned in a row in the second direction D2, and the upper-end portion of each of the support members 42 is attached to the corresponding first rail 21 in a detachable manner.

The reinforcement members 43 each couple together a pair of support members 42 connected to end portions of the corresponding pair of beam-like members 41 on the same side, between lower-end portions of the pair of support members 42. With this configuration, change in attitude of each of the support members 42 can be suppressed.

The following describes attachment structure of each of the rack units 40 to the corresponding first rails 21 or the corresponding second rails 22 more specifically. To a lower surface of each of the flange portions 24 of the first rails 21 and the second rails 22, a plurality of brackets 25 are fixed with bolts, for example, in a detachable manner. The brackets 25 are disposed at pitches corresponding to the third opening areas 2c. To each of the brackets 25 provided to a first rail 21, among a pair of rack units 40 having a pair of beam-like members 41 extending in the second direction D2 and is adjacent to each other in the second direction D2, an upper-end portion of a support member 42 of one rack unit 40 and an upper-end portion of a support member 42 of the other rack unit 40 can be attached with bolts. To each of the brackets 25 provided to a second rail 22, among a pair of rack units 40 having a pair of beam-like members 41 extending in the first direction D1 and is adjacent to each other in the first direction D1, an upper-end portion of a support member 42 of one rack unit 40 and an upper-end portion of a support member 42 of the other rack unit 40 can be attached with bolts. Thus, with the above-described configuration, by attaching and detaching the brackets 25 to and from the lower surface of each of the flange portions 24 of the first rails 21 and the second rails 22, each of the rack units 40 can be attached to and detached from the flange portions 24.

Positional Relation of Placement Surfaces of Rack Unit

As illustrated in FIGS. 3, 4, and 5, on the pair of beam-like members 41 that each of the rack units 40 includes, a plurality of FOUPs 9 are placed through the respective third opening areas 2c to which the rack unit 40 corresponds. On the placement member 51 such as the beam-like members 41, placement portions 50 on each of which a FOUP 9 is to be placed are formed, and upper surfaces of the placement portions 50 are placement surfaces 40a. Thus, when viewed from the vertical direction, a FOUP 9 placed on each of the placement surfaces 40a is positioned within the corresponding third opening area 2c. On upper surfaces of the pair of beam-like members 41, a plurality of (herein, three) positioning pins (positioning portions) 44 for positioning each of the FOUPs 9 on the rack unit 40 are formed. The positioning pins 44, also called kinematic pins, are fitted into recessed portions formed on a bottom surface of the FOUP 9, whereby movement of each of the FOUPs 9 with respect to the rack unit 40 is restricted.

Each of the rack units 40 is configured such that, when viewed from the horizontal direction, a FOUP 9 placed on a placement surface 40a thereof overlaps the first rails 21 and the second rails 22. A space between the placement surface 40a and the first rails 21 and a space between the placement surface 40a and the second rails 22 each have a size that does not allow a FOUP 9 to pass therethrough. The rack unit 40 is also configured such that the upper end of each of the FOUPs 9 placed on a placement surface 40a thereof is positioned below the lower end of the body portion 37 included by the traveling unit 31 of each of the vehicles 3 traveling directly above the FOUP 9. Furthermore, the rack unit 40 is configured such that the upper end of the FOUP 9 placed on the placement surface 40a is positioned above the treads 24a of the traveling rail 2.

Examples of Operation of Vehicle in Storing System

As illustrated in FIG. 2, in the traveling rail 2, first stopping areas 20a and second stopping areas (adjacent areas) 20b are set. The first stopping areas 20a are portions corresponding to a plurality of third opening areas 2c directly above the storage area 6 in the traveling rail 2. The second stopping areas 20b are portions corresponding to a plurality of second opening areas 2b each adjacent to the first opening areas 2a in the non-storage area 5 in the traveling rail 2. Thus, the first stopping areas 20a do not overlap the second stopping areas 20b.

Although the storage unit 4 is provided below the first stopping areas 20a, the storage unit 4 is not provided below the second stopping areas 20b. Below the second opening areas 2b (e.g., in areas directly below them), scaffolds 7 for work attached to the traveling rail 2 in a suspended manner are provided.

As one example, in the storing system 1, the first opening areas 2a extend in the first direction D1, and the second stopping areas 20b are portions corresponding to a plurality of second opening areas 2b aligned in a row in the first direction D1 on both sides of the first opening areas 2a in the second direction D2. Each of the vehicles 3 travels in both directions of the first direction D1 and the second direction D2 with the corresponding transfer unit 32 caused to protrude from the corresponding traveling unit 31 in the first direction D1. The following describes examples of operation of the vehicle 3 in this example.

When a FOUP 9 is delivered to or received from a predetermined rack unit 40 through a predetermined third opening area 2c, the traveling unit 31 stops at a first stopping area 20a such that the transfer unit 32 is positioned above the predetermined third opening area 2c with the transfer unit 32 caused to protrude from the traveling unit 31 in the first direction D1. In this state, the vehicle 3 raises and lowers the holding unit 32a of the transfer unit 32, thereby delivering or receiving the FOUP 9 to or from the predetermined rack unit 40 through the predetermined third opening area 2c.

In this example, in the state in which the traveling unit 31 stops at the second stopping area 20b, the vehicle 3 does not deliver or receive the FOUP 9 to or from the rack unit 40 through the third opening area 2c. In other words, a position where the traveling unit 31 is stopped when the vehicle 3 delivers or receives the FOUP 9 to or from the rack unit 40 through the third opening area 2c with the transfer unit 32 positioned above the third opening area 2c is set to be a position other than a position directly above the second opening area 2b.

The vehicle 3 may deliver or receive the FOUP 9 to or from the predetermined rack unit 40 in a manner described below through the predetermined third opening area 2c. Specifically, the vehicle 3 causes the traveling unit 31 to stop at, among a pair of third opening areas 2c adjacent to each other in the storage area 6, a portion corresponding to one third opening area 2c, and positions the transfer unit 32 above the other third opening area 2c. In this state, the vehicle 3 may deliver or receive the FOUP 9 to or from the predetermined rack unit 40 through the other third opening area 2c.

The vehicle 3 does not deliver or receive the FOUP 9 to or from the rack unit 40 through a first opening area 2a or a second opening area 2b.

When a FOUP 9 is delivered or received to or from a predetermined device port 8 through a predetermined first opening area 2a, the traveling unit 31 stops at a portion corresponding to a second stopping area 20b such that the transfer unit 32 is positioned above the first opening area 2a directly above the device port 8 with the transfer unit 32 caused to protrude from the traveling unit 31 in the second direction D2. In this state, the vehicle 3 raises and lowers the holding unit 32a of the transfer unit 32, thereby delivering or receiving the FOUP 9 to or from the device port 8 through the first opening area 2a. If the device port 8 is positioned directly below a portion displaced from a portion corresponding to a grid formed by a plurality of first rails 21 and a plurality of second rails 22 in a first opening area 2a, (i.e., if the device port 8 is positioned directly below a portion extending across the respective portions corresponding to two grids adjacent to each other), the traveling unit 31 may stop at the portion displaced from the portion corresponding to the grid in the second opening area 2b (i.e., the traveling unit 31 may stop at the portion extending across the respective portions corresponding to two grids adjacent to each other), and in this state, the vehicle 3 may deliver or receive the FOUP 9 to or from the device port 8.

Functions and Effects

As described above, in the storing system 1, each of the rack units 40 constituting the storage unit 4 is provided such that the corresponding beam-like members 41 as the placement member 51 on each of which a FOUP 9 is to be placed are positioned directly below the corresponding third opening areas 2c. This enables a plurality of the rack units 40 to be combined appropriately to constitute the storage unit 4 having a desired shape. Thus, compared to when the entire storage unit 4 is formed by a single rack, flexibility in installation of the storage unit 4 can be improved.

In the storing system 1, each of the rack units includes the support members 42 supporting the corresponding placement member 51, and the support members 42 are suspended from the traveling rail 2 in a detachable manner Thus, the placement member 51 can be easily disposed at a suitable height.

In the storing system 1, at least one of the rack units 40 is formed such that a plurality of placement portions 50, on each of which a FOUP 9 is to be placed, are aligned in a row in the corresponding placement member 51, and is also provided such that a direction in which the placement portions 50 are aligned in a row is parallel to the first direction D1 or the second direction D2. Thus, compared to when all of the respective rack units 40 are configured to correspond to a plurality of third opening areas 2c arranged in a matrix pattern (i.e., arranged to be aligned in a plurality of rows in both directions of the first direction D1 and the second direction D2), flexibility in installation of the storage unit 4 can be prevented from decreasing. This is particularly advantageous, for example, when a rack unit 40 for only one row of the third opening areas 2c is desired to be removed.

In the storing system 1, each of the areas surrounded by a pair of first rails 21 adjacent to each other and a pair of second rails 22 adjacent to each other forms an opening area having a size that allows a FOUP 9 to pass therethrough in the up-and-down direction, and each of the vehicles 3 travels while holding the FOUP 9 above the traveling rail 2 to deliver and receive the FOUP 9 to and from the placement member 51 through the third opening area 2c. Thus, also when the vehicle 3 travels above the traveling rail 2, a function and an effect of improving flexibility in installation of the storage unit 4 can be satisfactorily obtained.

Figure 6:
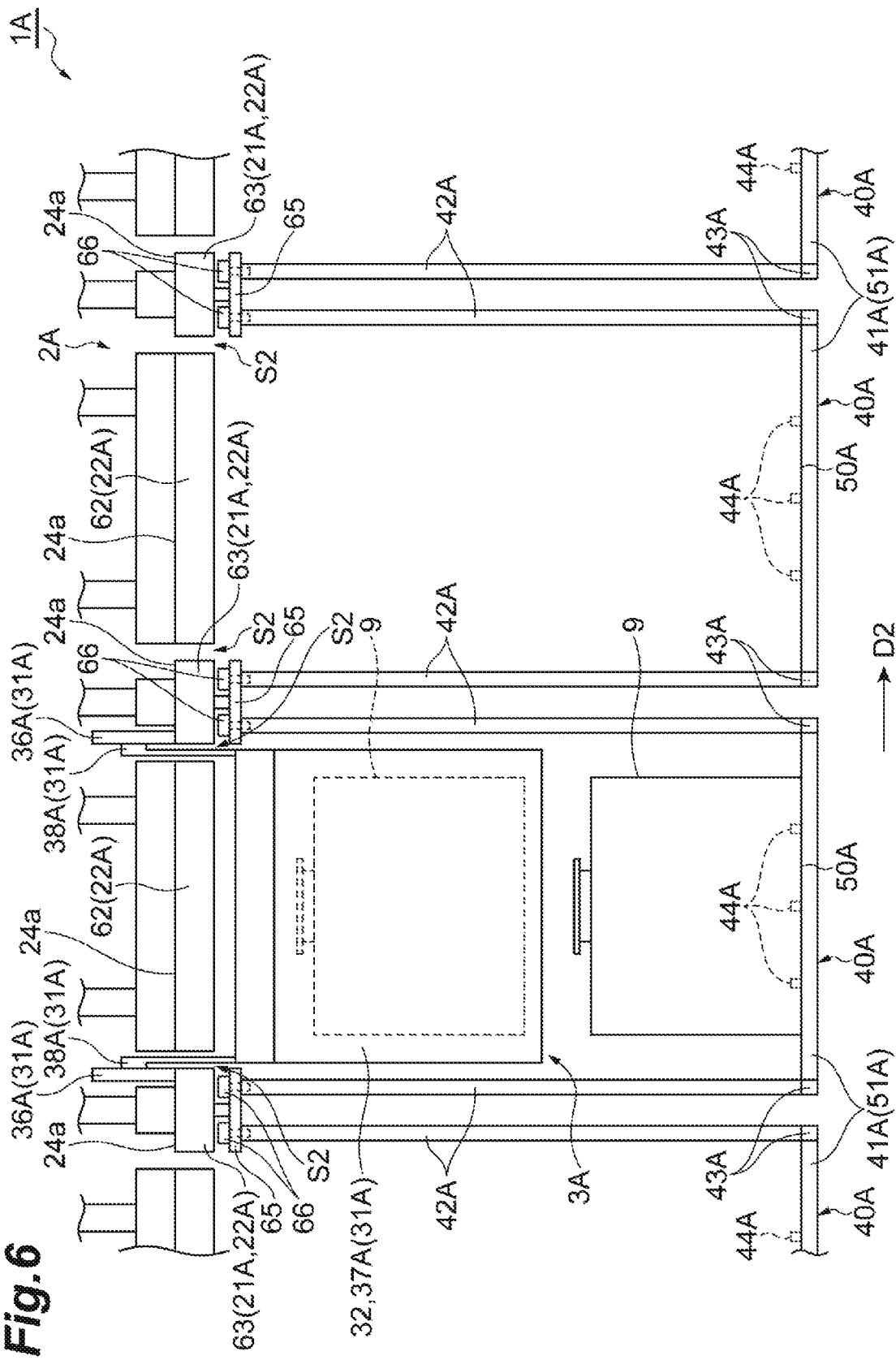
FIG. 6 is a front view of rack units included by a storing system according to a second example.
Figure 7:
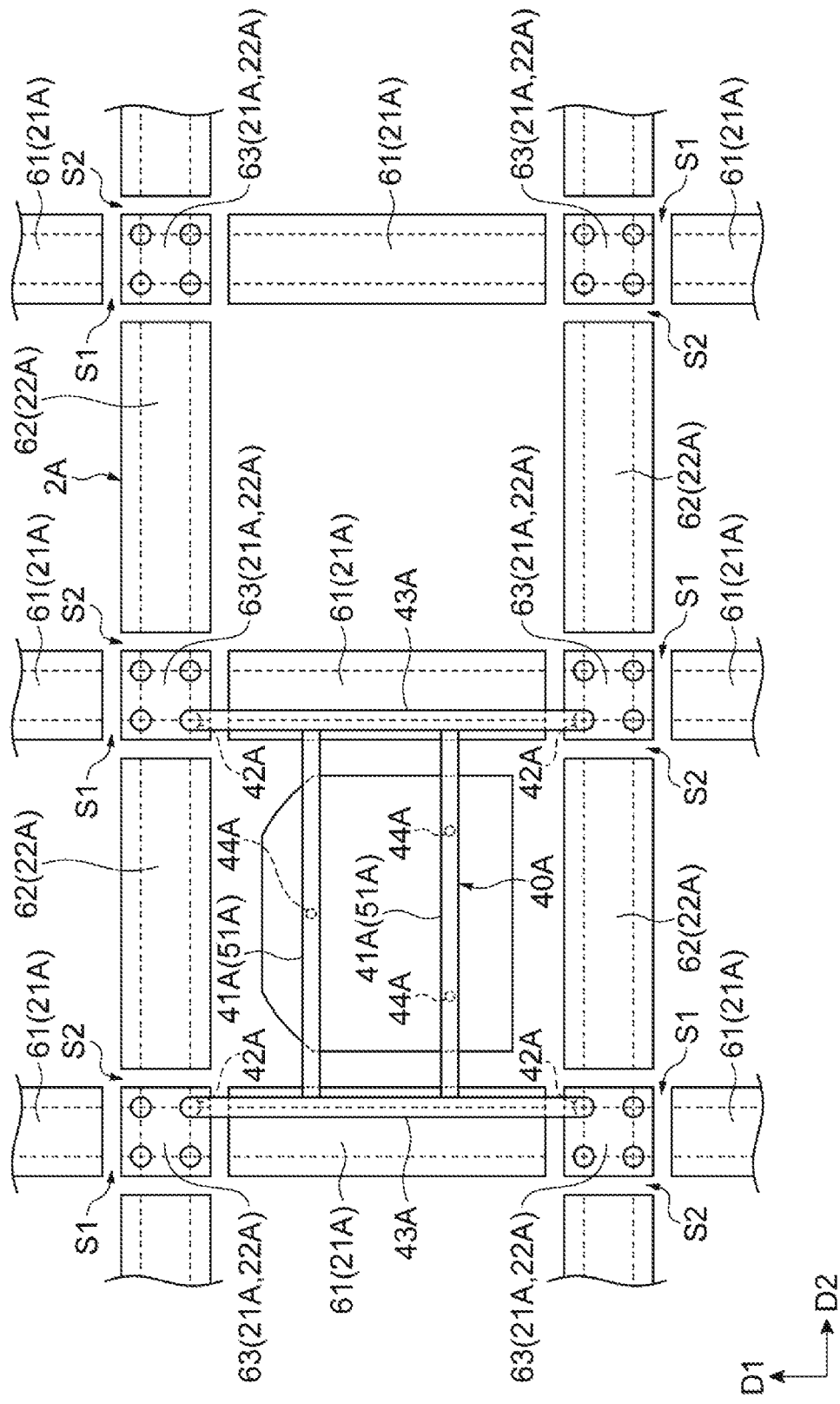
FIG. 7 is a bottom view of the rack unit in FIG. 6.

As described later in a second example, in a storing system 1A in which each of the vehicles 3A travels while holding a FOUP 9 below a traveling rail 2A, slits S1 and S2 need to be formed in the traveling rail 2A as shown in FIGS. 6 and 7. By contrast, as described in the first example, in the storing system 1 in which each of the vehicles 3 travels while holding a FOUP 9 above the traveling rail 2, such slits do not have to be formed in the traveling rail 2, and the respective wheels 36 do not fall into a slit when the vehicle 3 travels. Thus, compared to the storing system 1A according to the second example, vibrations when the vehicle 3 travels can be suppressed.

In the storing system 1, each of the placement members 51 is a pair of beam-like members 41 provided in a manner spaced apart from each other. This allows a FOUP 9 to be placed on the pair of beam-like members 41, and thus air currents can be prevented from being hindered by the rack units 40 compared to when the FOUP 9 is to be placed on a plate-like member, for example. Particularly when this storing system 1 is used in a clean room, air currents in up-and-down directions for keeping inside of the clean room in a clean state can be prevented from being hindered.

Second Example

Configuration of Storing System

As illustrated in FIGS. 6 and 7, the storing system 1A is different from the storing system 1 mainly in configurations of the traveling rail 2A, the vehicles 3A, and a rack unit 40A. The traveling rail 2A includes a plurality of first rail members 61, a plurality of second rail members 62, and a plurality of intersection rail members 63. Each of the first rail members 61 extends linearly in the first direction D1. The respective first rail members 61 form a plurality of rows disposed in plurality at predetermined intervals along the first direction D1. The respective rows of these first rail members 61 are aligned in the second direction D2. Each of the second rail members 62 extends linearly in the second direction D2. The respective second rail members 62 form a plurality of rows disposed in plurality at predetermined intervals along the second direction D2. The respective rows of these second rail members 62 are aligned in the first direction D1. The space between first rail members 61 adjacent to each other in a row of the first rail members 61 and the space between second rail members 62 adjacent to each other in a row of the second rail members 62 are the same.

Each of the intersection rail members 63 is disposed in a space between first rail members 61 adjacent to each other in a row of the first rail members 61 (i.e., a space between second rail members 62 adjacent to each other in a row of the second rail members 62). In the first direction D1, between each of the intersection rail members 63 and end portions of the respective first rail members 61 on both sides of the intersection rail member 63, slits (gaps) S1 are formed. In the second direction D2, between each of the intersection rail members 63 and end portions of the respective second rail members 62 on both sides of the intersection rail member 63, slits (gaps) S2 are formed. The slits S1 and S2 are formed to have a width sufficiently smaller than the diameter of each of the wheels 36 of the vehicles 3A. The first rail members 61, the second rail members 62, and the intersection rail members 63 are each suspended from a ceiling, for example.

The first rail members 61 and the intersection rail members 63 disposed along the first direction D1 constitute first rails 21A. The second rail members 62 and the intersection rail members 63 disposed along the second direction D2 constitute second rails 22A. In other words, the intersection rail members 63 serve both as the first rails 21A and the second rails 22A to constitute intersection portions of the first rails 21A and the second rails 22A. The traveling rail 2A forms lengthwise and crosswise a plurality of areas each of which is surrounded by a pair of first rails 21A adjacent to each other and a pair of second rails 22A adjacent to each other.

Each of the vehicles 3A includes a traveling unit 31A and a transfer unit 32. The traveling unit 31A includes a body portion 37A, four wheels 36A, and wheel support arms 38A. Each of the wheels 36A is rotatably supported by the corresponding wheel support arm 38A that is provided to protrude upward from the body portion 37A, and rolls on a tread 24a of the traveling rail 2A. In other words, the body portion 37A and the transfer unit 32 are suspended below the traveling rail 2A from the respective wheels 36A positioned above the traveling rail 2A, with the corresponding wheel support arms 38A interposed therebetween. The transfer unit 32 herein is configured in the same manner as the transfer unit 32 that each of the vehicles 3 of the first example has, and thus description thereof is omitted.

Each of the rack units 40A includes a placement member 51A, two pairs of support members 42A, and two connection members 43A connecting lower-end portions of the respective pair of support members 42A. Each of the rack units 40A illustrated in FIGS. 6 and 7 is configured to correspond to one area that is surrounded by a pair of first rails 21A adjacent to each other and a pair of second rails 22A adjacent to each other.

The placement member 51A is provided at a height that, in a state in which a FOUP 9 is placed on the upper surface thereof, allows each of the vehicles 3A to travel above the FOUP 9 without coming into contact with the FOUP 9. The placement member 51A is a pair of beam-like members 41A that are laid between the two connection members 43A. On upper surfaces of placement portions 50A of the beam-like members 41A, a plurality of (herein, three) positioning pins 44A are formed.

Each of the support members 42A is suspended from the corresponding intersection rail member 63 in a detachable manner. The support member 42A is provided four, for example, for one intersection rail member 63, and the respective support members 42A support placement members 51A of the respective rack units 40A that are provided to four corners of the intersection rail member 63. As one example, on the lower side of each of the intersection rail members 63, a bracket 65 is provided. In the bracket 65, through holes are formed at positions corresponding to the upper-end portions of the respective support members 42A. On the upper-end portion of each of the support members 42A, a threaded hole is formed in the axial direction. A bolt 66 inserted into each through hole of the bracket 65 is fastened into the threaded hole of the corresponding support member 42A, whereby the corresponding rack unit 40A is fixed to the intersection rail member 63. By removing each of the bolts 66 from the corresponding through hole, the corresponding rack unit 40A is removed from the intersection rail member 63. The configuration of each of the rack units 40A that is detachable from the traveling rail 2A is not limited to the example described above. For example, the rack unit 40A may be attached to the traveling rail 2A with a simple configuration in which locked portions are provided to each of the brackets 65, and locking portions are provided to the upper-end portions of the corresponding support members 42A, and the respective support members 42A are locked to the bracket 65. Alternatively, locked portions may be provided to the intersection rail member 63, and the respective support members 42A may be directly locked to the intersection rail member 63. Furthermore, a plurality of support members 42A provided to the same intersection rail member 63 may be shared by a plurality of rack units 40A.

Figure 8:
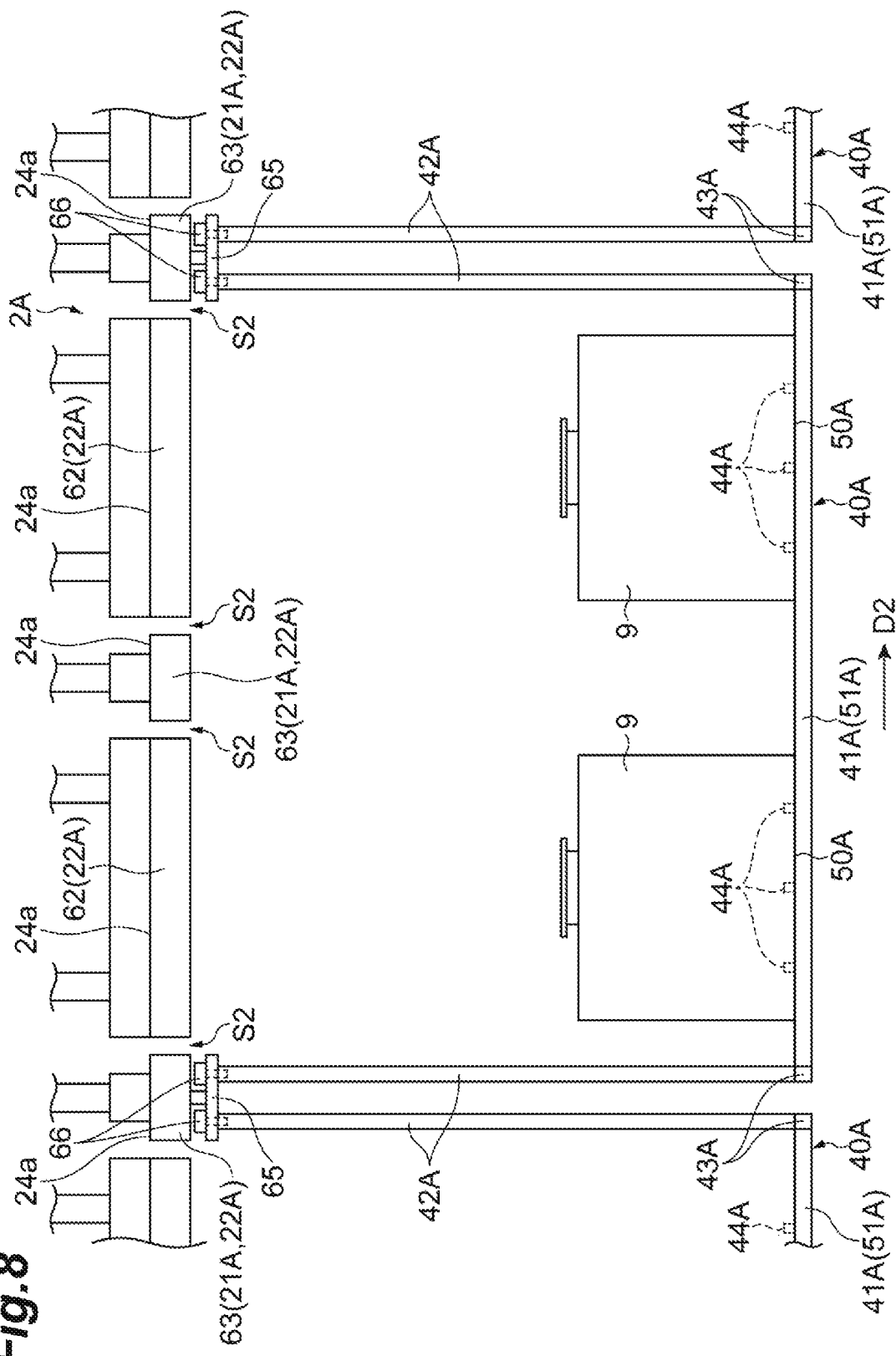
FIG. 8 is a front view of rack units included by the storing system according to the second example.

As illustrated in FIGS. 8 and 9, each of the rack units 40A may be configured to correspond to an area in which a plurality of areas, each of which is surrounded by a pair of first rails 21A adjacent to each other and a pair of second rails 22A adjacent to each other, are aligned. For example, the rack unit 40A may be configured to correspond to the areas aligned in a row in either direction of the first direction D1 or the second direction D2. As one example, each of the rack units 40A illustrated in FIGS. 8 and 9 is configured to correspond to the two areas that are aligned in a row in the second direction D2.

Operation of Vehicle

In the storing system 1A configured as described above, as illustrated in FIG. 6, the vehicle 3A uses the traveling unit 31A to travel and cause a FOUP 9 to pass between a plurality of support members 42A while using the transfer unit 32 to hold the FOUP 9 below the traveling rail 2A. At this time, because the slits 51 and S2 are formed to have a width sufficiently smaller than the diameter of each of the wheels 36A of the vehicle 3A, each of the wheels 36A can pass over the slits 51 when the vehicle 3A travels in the first direction D1, and each of the wheels 36A can pass over the slits S2 when the vehicle 3A travels in the second direction D2.

When each of the wheels 36A passes over the intersection rail members 63 in the first direction D1, the wheel support arm 38A supporting the wheel 36A passes through the slits S2. When each of the wheels 36A passes over the intersection rail members 63 in the second direction D2, the wheel support arm 38A supporting the wheel 36A passes through the slits 51. Thus, the vehicle 3A can travel along the traveling rail 2A without coming into contact with the traveling rail 2A.

Because each of the support members 42A is suspended from the corresponding intersection rail member 63 and the vehicle 3A does not travel directly below the intersection rail member 63, the vehicle 3A does not come into contact with the support member 42A. Thus, the vehicle 3A can travel along the traveling rail 2A without coming into contact with a rack unit 40A.

Because the transfer unit 32 is positioned below the traveling rail 2A, the vehicle 3A delivers and receives a FOUP 9 to and from the rack unit 40A without causing the FOUP 9 to pass through an area that is surrounded by a pair of first rails 21A adjacent to each other and a pair of second rails 22A adjacent to each other.

Functions and Effects

As described above, in the storing system 1A, each of the support members 42A is suspended from the corresponding intersection rail member 63 that is an intersection portion of the corresponding first rail 21A and the corresponding second rail 22A. Each of the vehicles 3A travels to cause a FOUP 9 to pass between the support members 42A while holding the FOUP 9 below the traveling rail 2A. Thus, also when the vehicle 3A travels below the traveling rail 2A, a function and an effect of improving flexibility in installation of the storage unit 4 can be satisfactorily obtained.

As described above in the first example, in the storing system 1 in which each of the vehicles 3 travels while holding a FOUP 9 above the traveling rail 2, a space, in the up-and-down direction, that is sufficient for the FOUP 9 held by the vehicle 3 to be moved needs to be kept between the ceiling of the semiconductor manufacturing plant and the traveling rail 2 as shown in FIG. 3. By contrast, as described in the second example, in the storing system 1A in which each of the vehicles 3A travels while holding a FOUP 9 below the traveling rail 2A, such a space does not have to be kept. Thus, the traveling rail 2A can be installed at a position closer to the ceiling of the semiconductor manufacturing plant than in the storing system 1 according to the first example. In other words, the traveling rail 2A can be installed at a position higher than the traveling rail 2 of the first example Thus, in a position where a rack unit 40A is not provided in the traveling rail 2A, a semiconductor processing device 10 that is relatively tall (e.g., a semiconductor processing device 10 that is taller than a height where the traveling rail 2 of the first example is installed) can be disposed below the traveling rail 2A.

As described above in the first example, in the storing system 1, for each of the vehicles 3 to deliver or receive a FOUP 9 to or from a device port 8 below the traveling rail 2, the FOUP 9 needs to be caused to pass through a first opening area 2a formed in the traveling rail 2. Thus, there is a restriction that the position of the first opening area 2a in the traveling rail 2 must be matched to the layout of the device port 8 below the traveling rail 2. By contrast, in the storing system 1A according to the second example, there is not such a restriction, and thus the traveling rail 2A can be installed flexibly regardless of the layout of the device port 8 disposed below the traveling rail 2A. In other words, flexibility in layout of device ports 8 disposed below the traveling rail 2A can be improved.

Modifications

In the foregoing, the first and second examples have been described. However, this disclosure is not limited to the first and second examples. For example, in the first example, each of the rack units 40 only has to be configured to correspond to at least one third opening area 2c, and each of all rack units 40 may be configured to correspond to one third opening area 2c. In other words, only one placement portion 50 that is a portion on which a FOUP 9 is to be placed may be formed on each of the placement members 51.

In the first example, when at least one of a plurality of rack units 40 is configured to correspond to a plurality of third opening areas 2c, any rack units 40 do not have to be configured to correspond to a plurality of third opening areas 2c aligned in a row in the first direction D1 or the second direction D2. Specifically, if at least one of the rack units 40 provided to one traveling rail 2 is configured to correspond to a plurality of third opening areas 2c, each of all rack units 40 configured to correspond to these third opening areas 2c may be configured to correspond to a plurality of first opening areas 2a arranged in a matrix pattern of m×n (m and n are integers of two or larger) in the first direction D1 and the second direction D2. In this example, m=n may be satisfied, or m<n or m>n may be satisfied. The one traveling rail 2 herein means a traveling rail 2 that forms a range in which each of the vehicles 3 can use the corresponding traveling unit 31 to travel by itself.

In the first and second examples, the first rails 21 and 21A and the second rails 22 and 22A may be disposed, not only on the same horizontal plane, but also on the same inclined plane, for example. The storing systems 1 and 1A do not have to include a plurality of vehicles 3 and 3A, respectively, and each may include only one.

In the first example, the protruding unit 33 of each of the vehicles 3 may be a unit configured to cause the corresponding transfer unit 32 from the corresponding traveling unit 31 to protrude in either direction of the first direction D1 or the second direction D2. In other words, the protruding unit 33 may be a unit configured to cause the transfer unit 32 to protrude from the traveling unit 31 in at least one direction of the first direction D1 and the second direction D2. For example, the protruding unit 33 may include a slide mechanism configured to move the transfer unit 32 forward and backward, and may use this slide mechanism to cause the transfer unit 32 to protrude from the traveling unit 31 in either direction of the first direction D1 or the second direction D2. Alternatively, the protruding unit 33 may include a swing mechanism configured to rotate an arm extending horizontally from the traveling unit 31 about the central axis on the traveling unit 31 thereby turning the transfer unit 32 held on the distal end side of the arm, and may use this swing mechanism to cause the transfer unit 32 to protrude from the traveling unit 31 in either direction of the first direction D1 or the second direction D2. The protruding unit 33 also may leave the transfer unit 32 to continuously protrude from the traveling unit 31 in either direction of the first direction D1 or the second direction D2.

In the first example, the rack units 40 and 40A may be provided below second stopping areas 20b. In this example, the vehicles 3 and 3A do not deliver or receive a FOUP 9 to or from the rack units 40 and 40A in a state in which the traveling units 31 and 31A stop at portions corresponding to the second stopping area 20b, respectively.

In the first and second examples, a plurality of (two, for example) rack units 40 and 40A provided adjacently to each other may share support members 42 and 42A on the side adjacent to each other, respectively. In other words, for example, in the second example, one (single) support member 42A may be suspended from each of the intersection rail members 63, and this support member 42A may be shared by a plurality of rack units 40A.

Articles stored by the storing system according to one configuration are not limited to FOUPs 9 in each of which a plurality of semiconductor wafers are accommodated, and may be other containers in each of which glass wafers, reticles, or the like are accommodated. The storing system according to one configuration can be used not only in the semiconductor manufacturing plant, but also in other facilities.

INDUSTRIAL APPLICABILITY

A storing system that enables flexibility in installation of a storage unit to be improved can be provided.

The invention claimed is:

1. A storing system comprising:
a traveling rail including a plurality of first rails extending in a first direction and a plurality of second rails extending in a second direction orthogonal to the first direction, the first rails and the second rails being disposed in a grid pattern on the same plane to form lengthwise and crosswise a plurality of areas each of which is surrounded by a pair of the first rails adjacent to each other and a pair of the second rails adjacent to each other;
a vehicle including a traveling unit configured to travel on the traveling rail in both directions of the first direction and the second direction and a transfer unit configured to hold an article to raise and lower the article; and
a storage unit, provided below the traveling rail, on which the article is to be placed, wherein
the traveling rail further includes a plurality of intersection rail members constituting intersection portions of the first rails and the second rails,
the vehicle delivers and receives the article to and from the storage unit,
the storage unit includes a plurality of rack units adjacent to each other,
each of the rack units includes a placement member on which the article is to be placed, is provided such that the placement member is positioned directly below the corresponding area, and is detachable from the traveling rail,
the storing system further comprises a plurality of brackets respectively provided to the intersection rail members,
each of the brackets allows four rack units, from the plurality of rack units, disposed on four corners of the corresponding intersection rail member to be individually detachable, and
each of the four rack units is individually detachable from the traveling rail through four brackets, from the plurality of brackets, respectively positioned on four corners of the rack unit.

2. The storing system according to claim 1, wherein each of the rack units includes a support member suspended from the traveling rail in a detachable manner and supporting the corresponding placement member.

3. The storing system according to claim 2, wherein at least one of the rack units is formed such that a plurality of placement portions, on each of which the article is to be placed, are aligned in a row in the corresponding placement member, and also is provided such that a direction in which the placement portions are aligned in a row is parallel to the first direction or the second direction.

4. The storing system according to claim 1, wherein
each of the areas forms an opening area having a size that allows the article to pass through the opening area in an up-and-down direction, and
the vehicle
travels while holding the article above the traveling rail, and
delivers and receives the article to and from the placement member through the opening area.

5. The storing system according to claim 2, wherein
each of the support members is suspended from an intersection portion of the corresponding first rail and the corresponding second rail, and
the vehicle travels to cause the article to pass between the support members while holding the article below the traveling rail.

6. The storing system according to claim 1, wherein each of the placement members is a pair of beam-like members provided in a manner spaced apart from each other.

7. The storing system according to claim 2, wherein
each of the areas forms an opening area having a size that allows the article to pass through the opening area in an up-and-down direction, and
the vehicle
travels while holding the article above the traveling rail, and
delivers and receives the article to and from the placement member through the opening area.

8. The storing system according to claim 3, wherein
each of the areas forms an opening area having a size that allows the article to pass through the opening area in an up-and-down direction, and
the vehicle
travels while holding the article above the traveling rail, and
delivers and receives the article to and from the placement member through the opening area.

9. The storing system according to claim 3, wherein
each of the support members is suspended from an intersection portion of the corresponding first rail and the corresponding second rail, and
the vehicle travels to cause the article to pass between the support members while holding the article below the traveling rail.

10. The storing system according to claim 2, wherein each of the placement members is a pair of beam-like members provided in a manner spaced apart from each other.

11. The storing system according to claim 3, wherein each of the placement members is a pair of beam-like members provided in a manner spaced apart from each other.

12. The storing system according to claim 4, wherein each of the placement members is a pair of beam-like members provided in a manner spaced apart from each other.

13. The storing system according to claim 5, wherein each of the placement members is a pair of beam-like members provided in a manner spaced apart from each other.

\* \* \* \* \*